United States Patent
Watarai

(10) Patent No.: US 12,447,912 B2
(45) Date of Patent: Oct. 21, 2025

(54) IN-VEHICLE CONTROL DEVICE AND MANUFACTURING METHOD

(71) Applicant: Hitachi Astemo, Ltd., Hitachinaka (JP)

(72) Inventor: Michihito Watarai, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 126 days.

(21) Appl. No.: 18/287,912

(22) PCT Filed: Feb. 2, 2022

(86) PCT No.: PCT/JP2022/003955
§ 371 (c)(1),
(2) Date: Oct. 23, 2023

(87) PCT Pub. No.: WO2023/281783
PCT Pub. Date: Jan. 12, 2023

(65) Prior Publication Data
US 2024/0198931 A1  Jun. 20, 2024

(30) Foreign Application Priority Data

Jul. 5, 2021 (JP) ................................ 2021-111319

(51) Int. Cl.
*B60R 16/02* (2006.01)
*H02G 3/14* (2006.01)

(52) U.S. Cl.
CPC ............ *B60R 16/02* (2013.01); *H02G 3/14* (2013.01)

(58) Field of Classification Search
CPC .. H05K 7/14; H05K 7/12; H05K 7/00; H05K 7/02; H05K 7/1401; H05K 7/1402;
(Continued)

(56) References Cited

U.S. PATENT DOCUMENTS 6,864,428 B2 * 3/2005 Reed ................... H05K 7/1417
174/135
7,896,751 B2 * 3/2011 Thompson ............. F16B 37/14
470/18

(Continued)

FOREIGN PATENT DOCUMENTS

JP  1-140889 A   9/1989
JP  2001-56703 A  2/2001
(Continued)

OTHER PUBLICATIONS

International Search Report (PCT/ISA/210) issued in PCT Application No. PCT/JP2022/003955 dated Apr. 19, 2022 with English translation (4 pages).

(Continued)

*Primary Examiner* — Angel R Estrada
(74) *Attorney, Agent, or Firm* — Crowell & Moring LLP

(57) ABSTRACT

Provided is an in-vehicle control device (1) including: a base (10); a cover (20) fixed to the base; a circuit board (30) housed in the base and the cover; and an electronic component (40) mounted on the circuit board, in which the base is made of a steel plate material, and includes a plate-shaped main body portion (13), a bottomed cylinder (14) having a U-shaped cross section in which one of front and back surfaces of the main body portion is recessed and protrudes to the other side, and a screw portion (15) provided on a peripheral surface of the cylinder, and the circuit board is fastened to the base by a fastening member (6, 7) screwed into the screw portion of the cylinder.

13 Claims, 13 Drawing Sheets

(58) Field of Classification Search
CPC ...... H05K 7/1407; H05K 7/1417; H02G 3/16; H02G 3/14; H02G 3/08; H02G 3/081; B16R 16/02; B16R 16/00; B16R 16/0239
USPC ........ 174/66, 67, 50, 520, 535; 220/3.2, 3.3, 220/4.02, 241, 242; 439/76.1, 76.2; 470/18, 19, 96
See application file for complete search history.

(56) References Cited

U.S. PATENT DOCUMENTS

| | | | | |
|---|---|---|---|---|
| 8,338,720 | B2* | 12/2012 | Burgi | H05K 5/0073 |
| | | | | 174/541 |
| 8,908,380 | B2* | 12/2014 | Ohhashi | H05K 5/006 |
| | | | | 361/752 |
| 11,777,249 | B2* | 10/2023 | Sumida | H02G 3/16 |
| | | | | 439/76.1 |
| 2011/0111868 | A1 | 5/2011 | Saito et al. | |

FOREIGN PATENT DOCUMENTS

| | | |
|---|---|---|
| JP | 2011-88190 A | 5/2011 |
| JP | 2014-75496 A | 4/2014 |

OTHER PUBLICATIONS

Japanese-language Written Opinion (PCT/ISA/237) issued in PCT Application No. PCT/JP2022/003955 dated Apr. 19, 2022 with English translation (6 pages).

* cited by examiner

IN-VEHICLE CONTROL DEVICE AND MANUFACTURING METHOD

TECHNICAL FIELD

The present invention relates to an in-vehicle control device and a manufacturing method thereof.

BACKGROUND ART

There is known a control device in which a projection provided on a die-cast base is passed through a hole drilled in a circuit board, and a clip is inserted into the projection to facilitate disassembly and assembly so that the circuit board is easily fixed to the base (PTL 1).

CITATION LIST

Patent Literature

PTL 1: JP 2001-56703 A

SUMMARY OF INVENTION

Technical Problem

In the field of automobiles, engine compartments are increasingly narrowed in order to ensure a wide space for occupants and luggage, and control devices mounted in engine compartments are required to have high waterproof performance. In addition, due to recent trends, ball grid array (BGA) packages are often applied to electronic components used in control devices, and it is important to firmly fix a circuit board to a base while maintaining flatness.

However, in the control device of PTL 1, since the circuit board is simply fixed to the base with the clip, the fixing structure of the circuit board lacks robustness.

An object of the present invention is to provide an in-vehicle control device and a manufacturing method thereof, which are capable of achieving both waterproofness and robustness of a fixing structure of a circuit board and suppressing warpage of the circuit board.

Solution to Problem

In order to achieve the above object, the present invention provides an in-vehicle control device including: a base; a cover fixed to the base; a circuit board housed in the base and the cover; and an electronic component mounted on the circuit board, in which the base is made of a steel plate material, and includes a plate-shaped main body portion, a bottomed cylinder having a U-shaped cross section in which one of front and back surfaces of the main body portion is recessed and protrudes to the other side, and a screw portion provided on a peripheral surface of the cylinder, and the circuit board is fastened to the base by a fastening member screwed into the screw portion of the cylinder.

Advantageous Effects of Invention

According to the present invention, it is possible to achieve both waterproofness and robustness of a fixing structure of a circuit board and to suppress warpage of the circuit board.

DESCRIPTION OF EMBODIMENTS

Embodiments of the present invention will be described below with reference to the drawings.

First Embodiment

—In-Vehicle Control Device—

Figure 1:
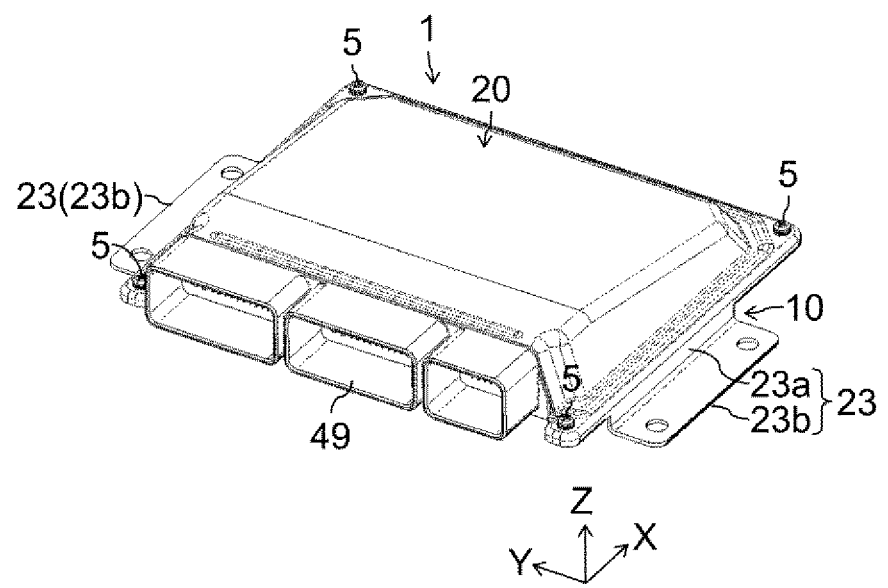
FIG. 1 is a perspective view of an in-vehicle control device according to a first embodiment of the present invention from a cover side.
Figure 2:
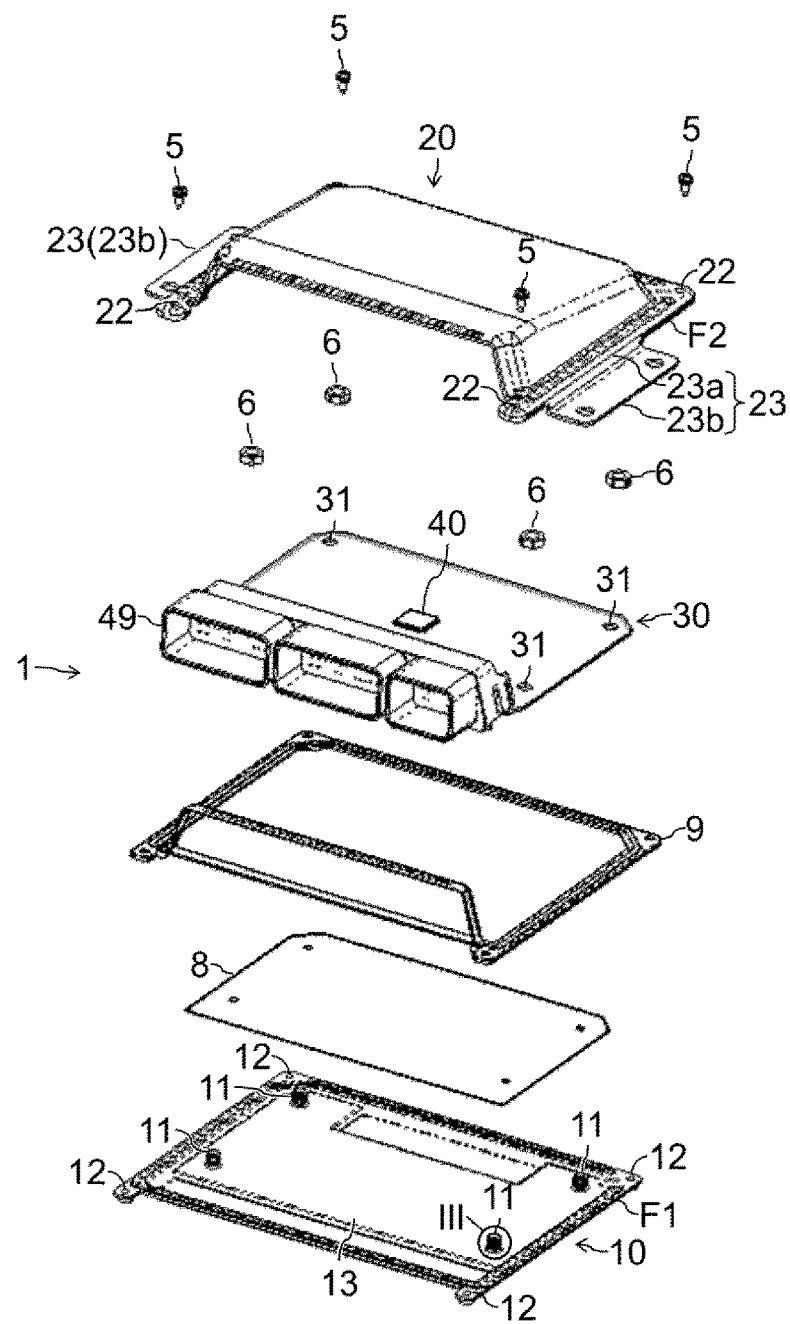
FIG. 2 is a developed view of the in-vehicle control device according to the first embodiment of the present invention.

FIG. 1 is a perspective view of an in-vehicle control device according to a first embodiment of the present invention from a cover side, and FIG. 2 is a developed view.

An in-vehicle control device 1 (hereinafter abbreviated as "control device 1") illustrated in FIGS. 1 and 2 is a kind of computer, and is an electronic control unit (ECU) attached to a structure of an automobile and mounted on the automobile. The control device 1 described in each of the following embodiments is mounted in, for example, an engine compartment of an automobile, but can also be mounted in a place other than the engine compartment of the automobile. The control device 1 includes a base 10, a cover 20, a circuit board 30 (FIG. 2), and an electronic component 40. These components will be described below.

—Base—

The base 10 is a base structure of the in-vehicle control device 1, and is made of a general-purpose steel plate material (hot rolled steel plate or cold rolled steel plate). Specifically, the base 10 is a rectangular plate-shaped member such as a square or a rectangle as a whole, and a plurality of heat dissipation fins (not illustrated) are provided on the outer wall surface. In particular, in the present embodiment, the base 10 is made of an aluminum plate material, and is not subjected to coating processing such as plating. A flange F1 for fixing to the cover 20 is provided on the outer peripheral portion of the base 10. As illustrated in FIG. 2, male screws 11 protruding upward (toward the cover 20) are provided near the four corners of the base 10. In addition, screw holes 12 are provided at four corners of the base 10 in the flange F1.

—Cover—

The cover 20 is formed in a convex dome shape on the side opposite to the base 10 (Z direction in FIG. 1), and constitutes a housing of the control device 1 together with the base 10. The cover 20 has a flange F2 for fixing to the base 10 on the outer peripheral portion, and is fixed to the base 10 by overlapping the flange F2 on the flange F1 of the base 10 and fastening the flange F2 with a plurality of (four in the present embodiment) screws 5. The screws 5 are screwed into the screw holes 12 of the base 10 through through holes 22 (FIG. 2) drilled in the four corners of the cover 20 of the flange F2. Thus, the cover 20 is fastened to the base 10, and surrounds and protects the circuit board 30 together with the base 10. In the present embodiment, for example, resins such as polybutylene terephthalate (PBT), polyphenylene sulfide (PPS), or nylon (PA) are used as the material of the cover 20, and the weight of the cover 20 is reduced. However, the cover 20 may be made of metal containing aluminum, iron, or the like as a main component.

In addition, the seal 9 is sandwiched between the flange F1 of the base 10 and the flange F2 of the cover 20, and thus waterproofness and airtightness between the base 10 and the cover 20 are enhanced. For the seal 9, for example, an adhesive made of a material such as a silicone-based material, an epoxy-based material, or a urethane-based material, or an O-ring made of a rubber-based material can be used. When the adhesive seal 9 is used, the flange F1 of the base 10 and the flange F2 of the cover 20 are firmly fixed by fastening with the screw 5 and adhesion with the seal 9 to ensure waterproofness and airtightness.

In the present embodiment, the control device 1 is attached to a structure of an automobile (for example, a bracket on the automobile side) by a bracket 23. In the present embodiment, the bracket 23 is molded integrally with the cover 20, but the bracket 23 may be formed on the base 10. When the bracket 23 is formed on the base 10, for example, the bracket 23 can also be formed when the base 10 is press-molded from a steel plate material. In the present example, the brackets 23 are provided at both ends in the longitudinal direction (Y direction in FIG. 1) of the cover 20. The brackets 23 are formed in an L shape by leg portions 23a extending from the cover 20 to the base 10 side (−Z direction in FIG. 1) beyond the base 10, and flange portions 23b bent from tips of the leg portions 23a along the XY plane. Each flange portion 23b is fastened to a structure of an automobile with a plurality of (two in the present embodiment) mounting screws (not illustrated).

—Circuit Board/Electronic Component—

The circuit board 30 is housed in the base 10 and the cover 20. The electronic component 40 and connectors 49 are mounted on the circuit board 30. The circuit board 30 has through holes 31 (FIG. 2) at four corners, and is fixed to the base 10 by making the male screw 11 of the base 10 pass through the through holes 31 and tightening nuts 6 (FIG. 2) to the male screws 11. In the present embodiment, a Mylar sheet 8 (FIG. 2) is interposed between the circuit board 30 and the base 10 to electrically insulate the circuit board 30 and the base 10 from each other. The Mylar sheet 8 is, for example, an insulating film or an insulating sheet made of polyester. A structure (a sandwich structure to be described later) in which an adhesive or the like for sealing is sandwiched between the circuit board 30 and the base 10 is not employed).

The connector 49 is made of resins such as polybutylene terephthalate (PBT), polyamide (PA), and polyphenylene sulfide (PPS). The connector 49 has a plurality of connector terminals made of metal containing copper as a main component, and is connected to a connector (not illustrated) at a tip of a harness extending from a communication partner device on the automobile side. The connector terminal is a terminal for exchanging a voltage and a current with a connection partner, and is connected to a circuit formed on the circuit board 30 by soldering, press fitting, or the like. The connector 49 is exposed from a housing including the base 10 and the cover 20, but the seal 9 is also interposed between the connector 49 and the base 10 and the cover 20. Accordingly, the periphery of the connector 49 is also sealed with the seal 9 to ensure waterproofness.

The electronic component 40 may include various electronic components such as a ball grid array (BGA) package and a quad flat no lead (QFN) package although neither is illustrated.

—Male Screw—

Figure 3:
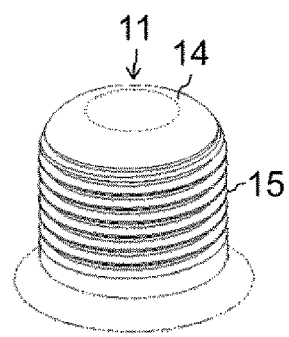
FIG. 3 is an enlarged view of a portion III in FIG. 2.
Figure 4:
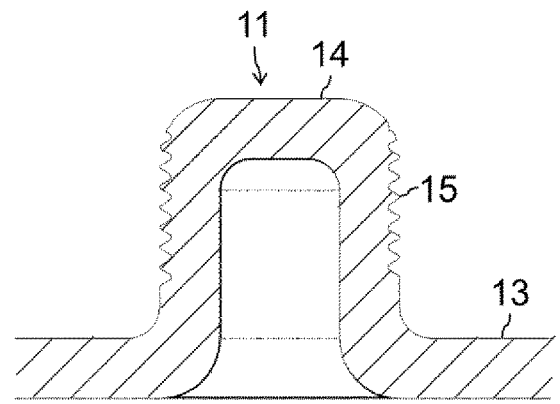
FIG. 4 is a cross-sectional view of a male screw illustrated in FIG. 3.
Figure 5:
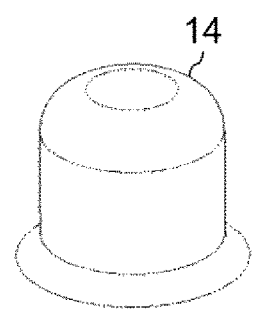
FIG. 5 is a perspective view of a male screw in a semi-finished state for describing a method of forming the male screw illustrated in FIG. 3.
Figure 6:
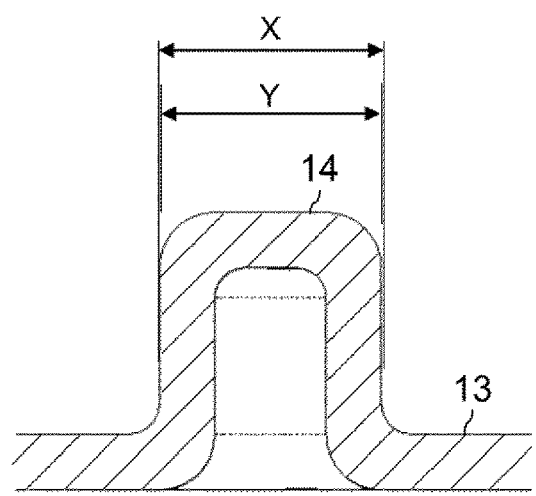
FIG. 6 is a cross-sectional view of the male screw in the semi-finished state illustrated in FIG. 5.

FIG. 3 is an enlarged view of a portion III in FIG. 2, and FIG. 4 is a cross-sectional view taken along a plane including a central axis of the male screw. FIG. 5 is a perspective view of a male screw in a semi-finished state for describing a method of forming the male screw, and FIG. 6 is a cross-sectional view thereof. In these drawings, the already described elements are denoted by the same reference numerals as those in the previously described drawings, and description thereof is omitted.

The base 10 includes a main body portion 13, a cylindrical portion 14, and a screw portion 15. As described above, the base 10 is made of a steel plate material, and the main body portion 13, the cylindrical portion 14, and the screw portion 15 are an integral structure made of the same steel plate material.

The main body portion 13 is a main body of the base 10, and is a plate-shaped portion that occupies most of the base 10 excluding the cylindrical portion 14 and the screw portion 15. A portion having a U-shaped cross section where one of front and back surfaces (in this example, an outer wall surface on the side opposite to the circuit board 30) of the main body portion 13 is recessed and protrudes to the other side (the circuit board 30 side) is the cylindrical portion 14, and the cylindrical portion 14 is a non-penetrating bottomed portion without a cup-shaped hole. A plurality of (four in the present embodiment) cylindrical portions 14 are provided near the four corners of the main body portion 13 of the base 10, respectively.

The screw portion 15 is an element for screwing a fastening member to fasten the circuit board 30 to the base 10, and is provided on the peripheral surface of each cylindrical portion 14. In the present embodiment, the screw portion 15 is provided on the outer peripheral surface of each cylindrical portion 14, and the cylindrical portion 14 constitutes the male screw 11 described above. In the present embodiment, the nut 6 described in FIG. 2 is used as a fastening member screwed into the screw portion 15 of the male screw 11. The nut 6 is a standard product. Therefore, the height of the cylindrical portion 14 (the amount of protrusion from the circuit board 30 stacked on the main body portion 13) needs to be about the thickness of the nut 6. In the U-shaped cross section of the cylindrical portion 14 illustrated in FIG. 6, a plate thickness sufficient for forming the screw portion 15 for fixing the nut 6 is ensured. In the present embodiment, the U-shaped cross section of the cylindrical portion 14 has about a plate thickness (for example, 1.5 mm) of the original steel plate material as a whole.

In the base 10, a steel plate material is press-molded into a shape having the main body portion 13 having the above-described shape and a plurality of cylindrical portions 14, and then an outer peripheral surface of the cylindrical portion 14 is die-processed to form the male screw 11. At this time, the outer peripheral surface of the cylindrical portion 14 formed by press working is configured such that a difference between a diameter X (FIG. 6) of a root portion close to the main body portion 13 and a diameter Y (FIG. 6) of a tip portion far from the main body portion 13 is 0.1 mm or less. Here, the male screw 11 to be formed is preferably a screw having a nominal diameter of about M3 or M4, that is, about 3 mm to 4 mm. Then, when the base 10 having the male screw 11 is manufactured, the Mylar sheet 8 is placed on the base 10, the circuit board 30 is placed through the male screw 11 in the through hole 31 (FIG. 2), and the nut 6 is tightened to each of the male screws 11. The circuit board 30 is fastened to the base 10 by the fastening member (nut 6) screwed into the screw portion 15 (male screw 11) of the cylindrical portion 14 in this manner. Furthermore, the seal 9 is disposed at a predetermined position of the base 10 and the connector 49, and the cover 20 is mounted on the base 10 to manufacture the control device 1.

Note that the order of installation of the seal 9 is not limited to the above, and the seal 9 may be installed before the circuit board 30 is installed. In addition, the seal 9 may be divided into a seal portion in the outer peripheral region of the base 10 and a seal portion around the connector, the seal portion in the outer peripheral region of the base 10 may be installed on the base 10, and then the circuit board 30 may be fixed, and the seal portion around the connector may be further installed.

—Effects—

(1) In general, when a circuit board is fixed to a plate-shaped base, a structure is often employed in which a pilot hole is drilled in the base, a press-fit fastener having a female screw is press-fitted into the pilot hole, and a screw passing through the circuit board is screwed into the press-fit fastener. In this case, a fine gap is generated between the pilot hole and the press-fit fastener, and the control device lacks waterproofness in consideration of being mounted in the engine compartment. Therefore, a sandwich structure is generally employed in which an adhesive also serving as a seal is applied to the base to surround the outer periphery of the circuit board, and the adhesive is sandwiched between the base and the cover. However, although the sandwich structure has high waterproofness, it is difficult to suppress warpage of the circuit board, the frame ground (FG) is unstable due to variations in flatness, and the sandwich structure is not suitable for fixing a circuit board on which a BGA package having poor warpage tolerance is mounted.

On the other hand, in the present embodiment, the base 10 of the control device 1 is made of one general-purpose steel plate material as an integrated structure of the male screw 11 provided with the screw portion 15 in the non-penetrating cylindrical portion 14 having a U-shaped cross section and the plate-shaped main body portion 13. The male screw 11 is a non-penetrating structure formed of the same material as the main body portion 13 of the base 10, and the fastening portion of the base 10 and the circuit board 30 by the male screw 11 and the nut 6 has a water shielding structure without a passage of water passing through the base 10 and reaching the circuit board 30. Therefore, since sealing of the fastening portion is unnecessary, and it is not necessary to employ a sandwich structure in which an adhesive is sandwiched, warpage of the circuit board 30 at the time of fastening to the base 10 can be suppressed, and flatness of the circuit board 30 suitable for application of a BGA package can be ensured. In addition, since the fastening structure is a screw fastening structure, the robustness of the fixing structure of the circuit board 30 is also high. Therefore, it is possible to achieve both waterproofness and robustness of the fixing structure of the circuit board 30 and to suppress warpage of the circuit board 30. Since the warpage of the circuit board 30 is suppressed, the stability of the frame ground (FG) is also improved.

In addition, by using a general-purpose steel plate material that is easily available, the base 10 can be manufactured at low cost, and the manufacturing cost of the control device 1 can be reduced.

Furthermore, if the base 10 is made of die-cast, an unnecessary portion such as a rib may have to be provided in the base 10 for the purpose of ensuring the melt flowability in the mold. Also in this regard, in the present embodiment, since the base 10 is made of a steel plate material, footwear such as ribs generated in the case of employing die casting becomes unnecessary. This point can also contribute to weight reduction and cost reduction.

(2) Since an engine compartment of an automobile tends to be narrowed, a control device mounted in the engine compartment is required to be highly resistant to salt damage in order to increase a degree of freedom of layout. If the base 10 was made of die-cast, sufficient resistance to salt damage cannot be ensured due to the characteristics of the die-cast material.

In this regard, in the present embodiment, since the base 10 of the control device 1 is made of a high-purity aluminum steel plate, high resistance to salt damage can be ensured.

In addition, due to the characteristics of the material of the aluminum steel plate, the weight of the base 10 can be reduced, which can contribute to the weight reduction of the control device 1 and the improvement in fuel efficiency of the automobile on which the control device 1 is mounted.

However, depending on the degree of resistance to salt damage required, other materials such as iron and copper may be used, or the base 10 may be manufactured from these other materials and subjected to coating processing such as plating to increase the resistance to salt damage.

(3) Since the cylindrical portion 14 is the male screw 11 having the screw portion 15 on the outer peripheral surface, the cylindrical portion protrudes toward the circuit board 30. In this case, the male screw 11 serves as a positioning pin at the time of assembling the control device 1, and the circuit board 30 can be disposed at an appropriate position only by placing the circuit board 30 on the base 10 to pass the male screw 11 through the through hole 31.

(4) Since the outer peripheral surface of the cylindrical portion 14 has a diameter difference of 0.1 mm or less between the root portion close to the main body portion 13 and the tip portion far from the main body portion 13, it is possible to form the screw portion 15 having a quality sufficient to tighten the nuts 6 of standard products of about M3 and M4. This point also contributes to stabilization of the fixing structure of the circuit board 30.

Second Embodiment

Figure 7:
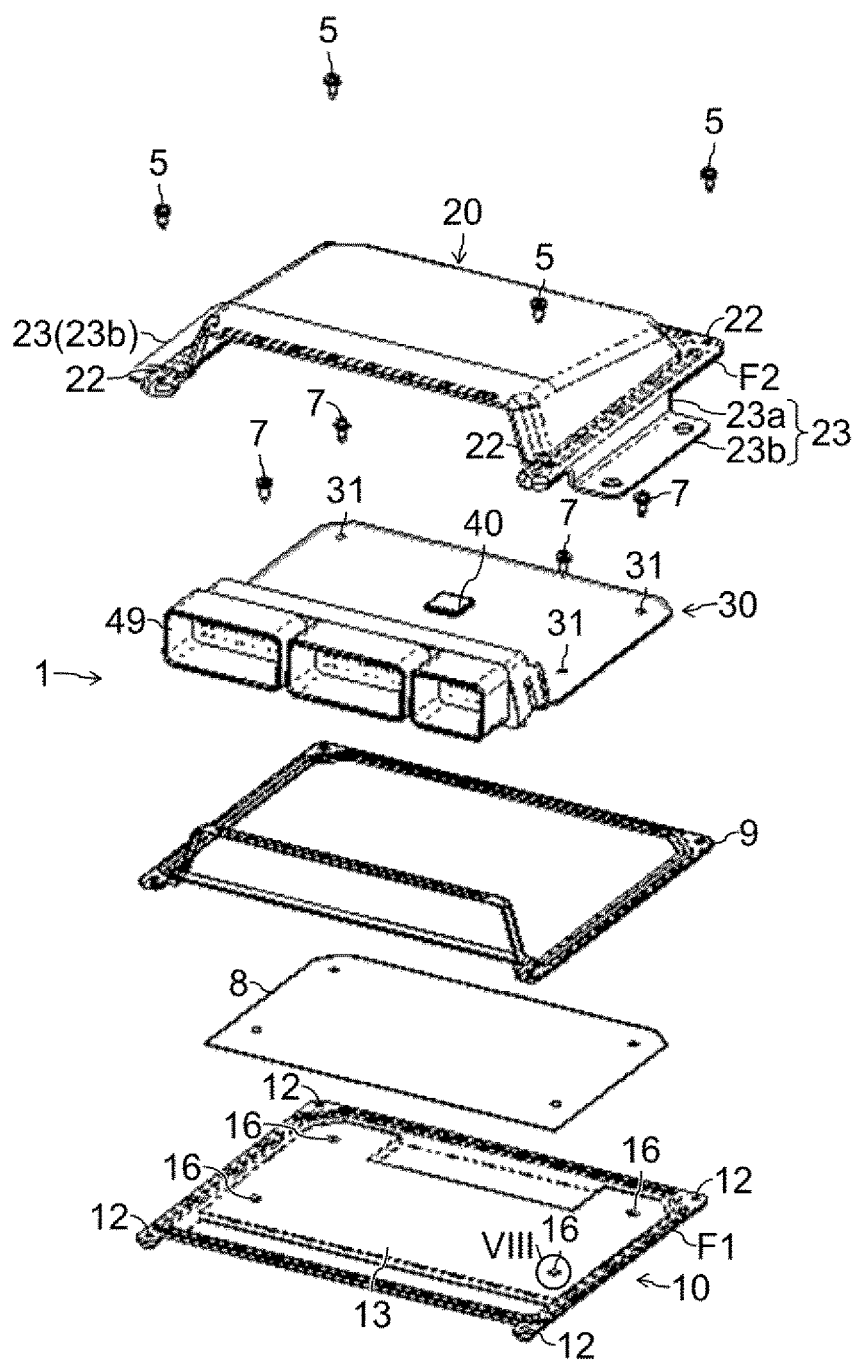
FIG. 7 is a developed view of an in-vehicle control device according to a second embodiment of the present invention.
Figure 8:
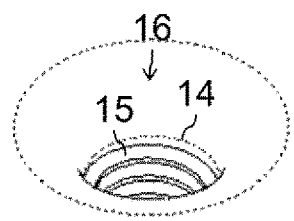
FIG. 8 is an enlarged view of a portion VIII in FIG. 7.
Figure 9:
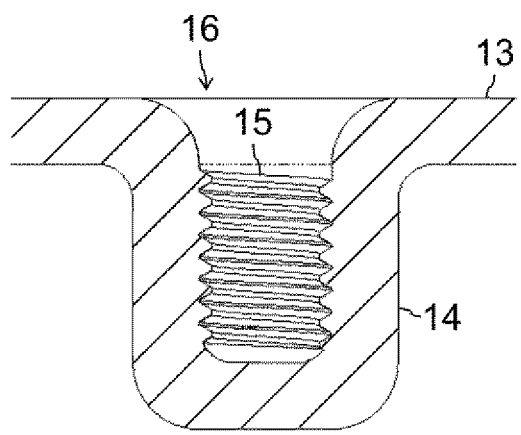
FIG. 9 is a cross-sectional view of a female screw illustrated in FIG. 7.
Figure 10:
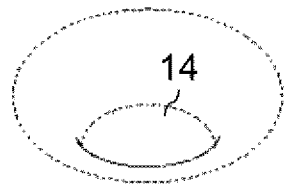
FIG. 10 is a perspective view of a female screw in a semi-finished state for describing a method of forming the female screw shown in FIG. 7.
Figure 11:
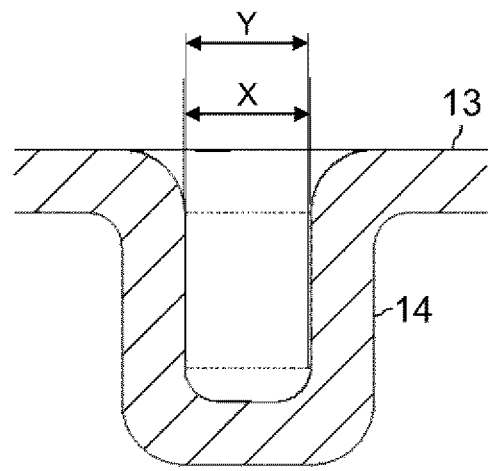
FIG. 11 is a cross-sectional view of the female screw in the semi-finished state illustrated in FIG. 10.

FIG. 7 is a developed view of an in-vehicle control device according to a second embodiment of the present invention, FIG. 8 is an enlarged view of a portion VIII in FIG. 7, and FIG. 9 is a cross-sectional view taken along a plane including a central axis of a female screw. FIG. 10 is a perspective view of a female screw in a semi-finished state for describing a method of forming the female screw, and FIG. 11 is a cross-sectional view thereof. FIGS. 7 to 11 correspond to FIGS. 2 to 6 of the first embodiment. In FIGS. 7 to 11, the same or corresponding parts as those in the first embodiment are denoted by the same reference numerals as those in the previously described drawings, and description thereof is omitted.

The present embodiment is different from the first embodiment in that the cylindrical portion 14 protrudes on the side opposite to the circuit board 30 and the screw portion 15 on the inner peripheral surface is provided to constitute the female screw 16, and the fastening member for fastening the circuit board 30 to the base 10 is a screw (male screw) 7.

In the present embodiment, the base 10 is formed by press-molding a steel plate material into a shape having the main body portion 13 and the plurality of cylindrical portions 14, and then tapping the screw portion 15 on the inner peripheral surface of the cylindrical portion 14 using a tap to form the female screw 16. The inner peripheral surface of the cylindrical portion 14 formed by press working is configured such that a difference between a diameter X (FIG. 11) of a root portion close to the main body portion 13 and a diameter Y (FIG. 11) of a tip portion far from the main body portion 13 is 0.1 mm or less. The female screw 16 is a screw having a nominal diameter of about M3 or M4, that is, about 3 mm to 4 mm. After the base 10 having the female screw 16 is manufactured, the Mylar sheet 8, the seal 9, and the circuit board 30 are placed on the base 10, and the screw 7 is tightened to the female screw 16 through each through hole 31 (FIG. 7) of the circuit board 30. In this manner, the circuit board 30 is fastened to the base 10 by the fastening member (screw 7) screwed into the screw portion 15 (female screw 16) of the cylindrical portion 14, and the cover 20 is further mounted on the base 10 to manufacture the control device 1.

The present embodiment is similar to the first embodiment in other points.

Also in the present embodiment, effects similar to those of the first embodiment can be obtained. Since the cylindrical portion 14 has a shape in which one of the front and back surfaces of the steel plate material is recessed and protrudes to the other side, the female screw 16 can be constituted by providing the screw portion 15 on the inner peripheral surface. Therefore, if the protruding direction of the cylindrical portion 14 is appropriately changed, the cylindrical portion 14 can be made not only the male screw 11 but also the female screw 16 depending on whether the nut or the screw is used as the fastening member.

Third Embodiment

Figure 12:
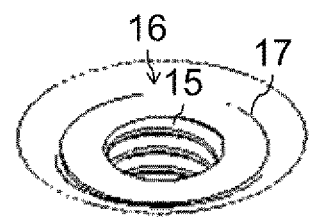
FIG. 12 is an enlarged view of a female screw provided on a base of an in-vehicle control device according to a third embodiment of the present invention.
Figure 13:
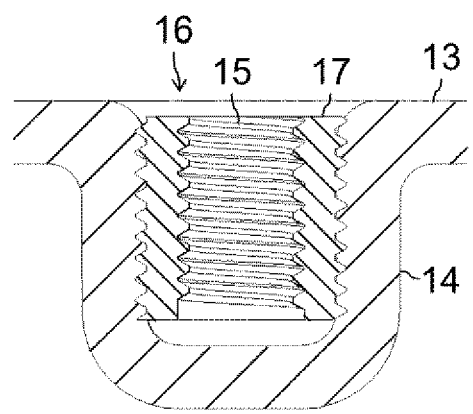
FIG. 13 is a cross-sectional view of the female screw illustrated in FIG. 12.
Figure 14:
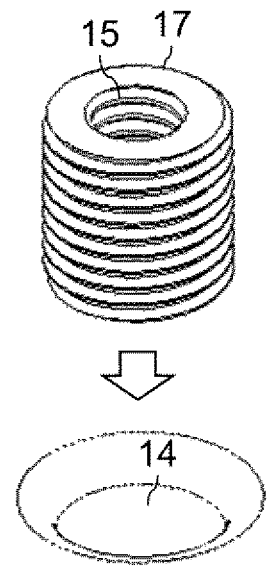
FIG. 14 is an exploded view of the female screw illustrated in FIG. 12.

FIG. 12 is an enlarged view of a female screw provided in a base of an in-vehicle control device according to a third embodiment of the present invention, and FIG. 13 is a cross-sectional view taken along a plane including a central axis of the female screw, and corresponds to FIGS. 8 and 9 of the second embodiment. FIG. 14 is an exploded view of the female screw. In FIGS. 12 to 14, the same or corresponding parts as those in the already described embodiments are denoted by the same reference numerals as those in the previously described drawings, and description thereof is omitted.

The present embodiment is different from the first embodiment in that the cylindrical portion 14 constitutes the female screw 16 by attaching the insert nut 17 as the screw portion 15 to the inner peripheral surface, and the fastening member for fastening the circuit board 30 to the base 10 is the screw 7. In the second embodiment, the case where the inner peripheral surface of the cylindrical portion 14 is tapped to constitute the female screw 16 has been exemplified, but in the present embodiment, for example, a selftapping type insert nut 17 is screwed into the inner surface side of the cylindrical portion 14 to constitute the female screw 16.

The present embodiment is similar to the second embodiment in other points.

The female screw 16 can also be formed by the method as in the present embodiment, and the same effects as those of the second embodiment can be obtained.

Fourth Embodiment

Figure 15:
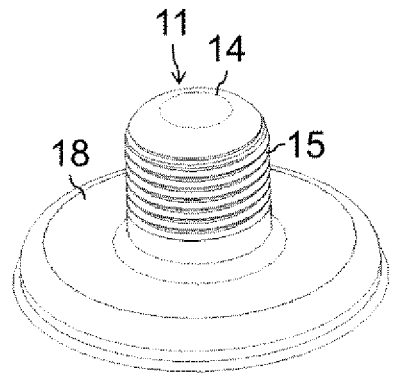
FIG. 15 is an enlarged view of a male screw provided on a base of an in-vehicle control device according to a fourth embodiment of the present invention.
Figure 16:
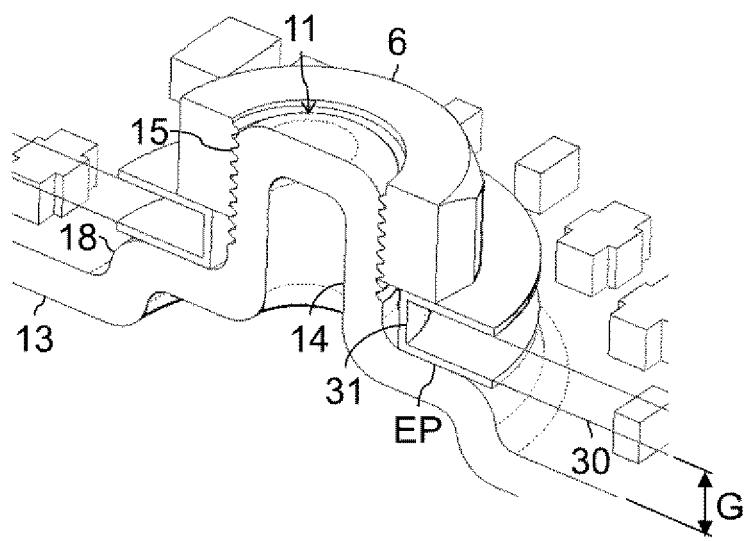
FIG. 16 is a cross-sectional view of an example of a fastening structure using the male screw illustrated in FIG. 15.
Figure 17:
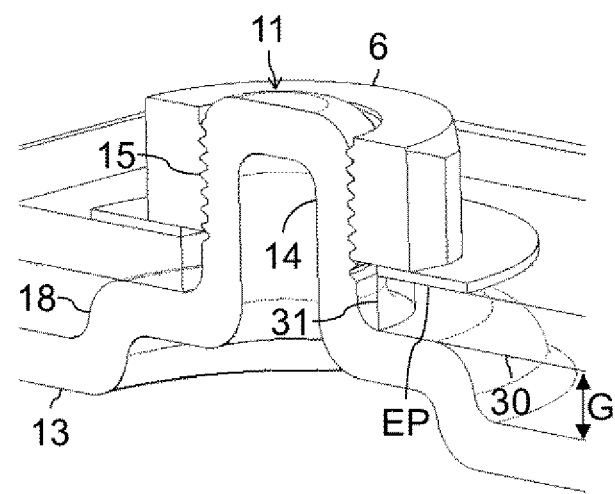
FIG. 17 is a cross-sectional view of another example of the fastening structure using the male screw illustrated in FIG. 15.
Figure 18:
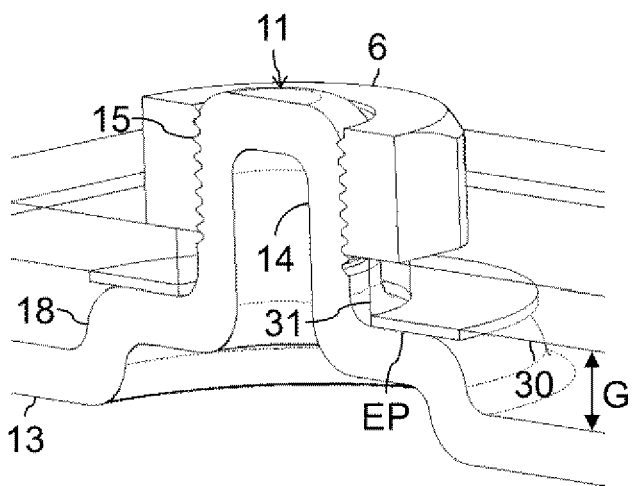
FIG. 18 is a cross-sectional view of still another example of the fastening structure using the male screw illustrated in FIG. 15.

FIG. 15 is an enlarged view of a male screw provided on a base of an in-vehicle control device according to a fourth embodiment of the present invention, and FIG. 16 is a cross-sectional view of an example of a fastening structure using the male screw illustrated in FIG. 15. FIG. 17 is a cross-sectional view of another example of the fastening structure using the male screw illustrated in FIG. 15, and FIG. 18 is a cross-sectional view of still another example of the fastening structure using the male screw illustrated in FIG. 15. In FIGS. 15 to 17, the same or corresponding parts as those in the already described embodiments are denoted by the same reference numerals as those in the previously described drawings, and description thereof is omitted.

A first point that the present embodiment is different from the first embodiment is that the base 10 is in contact with a wiring pattern of the circuit board 30 directly or via a fastening member (the nut 6 in the present embodiment), and the circuit board 30 and the base 10 are electrically connected.

In the present embodiment, an electrode pad EP for FG is provided in the through hole 31 of the circuit board 30. A ground terminal (not illustrated) of the wiring pattern of the circuit board 30 is connected to the electrode pad EP. The electrode pad EP has, for example, a ring shape made of copper.

The electrode pad EP illustrated in FIG. 16 has a U-shaped cross-sectional shape opening on the outer peripheral side, and embraces the circuit board 30 from both front and back surfaces when attached to the through hole 31. Therefore, the electrode pad EP is interposed both between the circuit board 30 and the nut 6 and between the circuit board 30 and the base 10 (a pedestal portion 18 of the base 10 in this example), and the electrode pad EP as a wiring pattern directly contacts the base 10 and contacts the base 10 via the nut 6.

The electrode pad EP illustrated in FIG. 17 has a washer shape (flat plate ring shape), and is covered with the male screw 11 and is interposed between the circuit board 30 and the nut 6. The electrode pad EP illustrated in FIG. 17 is not interposed between the circuit board 30 and the pedestal portion 18, and is electrically connected to the base 10 (male screw 11) only by a route passing through the nut 6.

The electrode pad EP illustrated in FIG. 18 also has a washer shape (flat plate ring shape) as in the example of FIG. 17, and is covered with the male screw 11 and is interposed between the base 10 and the circuit board 30. The electrode pad EP illustrated in FIG. 18 is not interposed between the circuit board 30 and the nut 6, and is electrically connected to the base 10 (pedestal portion 18) only by a direct route.

By employing a structure in which the wiring pattern of the circuit board 30 is sandwiched between the base 10 and the nut 6 in this manner, it is possible to ensure a highly reliable and stable FG by the fastening force of the nut 6.

In addition, a second point that the present embodiment is different from the first embodiment is that the base 10 includes the pedestal portion 18 protruding stepwise from the main body portion 13 toward the circuit board 30, and the cylindrical portion 14 is provided on the pedestal portion 18. That is, the circuit board 30 is sandwiched between the pedestal portion 18 and the nut 6 which is a fastening member. Therefore, the pedestal portion 18 is interposed between the circuit board 30 and the main body portion 13 of the base 10, and the circuit board 30 is separated from the main body portion 13 by a gap G ensured by the pedestal portion 18.

The pedestal portion 18 has a disk shape concentric with the cylindrical portion 14, and is molded together with the cylindrical portion 14 and the like by press working using a steel plate material shared with the cylindrical portion 14 and the like as a material. The thickness of the pedestal portion 18 is also about the plate thickness (for example, 1.5 mm) of the steel plate material used similarly to the cylindrical portion 14 and the main body portion 13. The pedestal portion 18 protrudes from the main body portion 13 toward the circuit board 30, and the cylindrical portion 14 (male screw 11) further protrudes from the ground center of the pedestal portion 18. The surface of the pedestal portion 18 facing the circuit board 30 is smooth, and the circuit board 30 is received on this smooth surface.

By providing the pedestal portion 18 to ensure the gap G between the circuit board 30 and the base 10 in this manner, even when the electronic component 40 is mounted on the surface of the circuit board 30 facing the base 10, it is possible to prevent the electronic component 40 and the base 10 from coming into contact with each other and to avoid an electrical short. Accordingly, the electronic component 40 can be mounted on both the front and back surfaces of the circuit board 30.

In the present embodiment, the configuration other than the above is the same as that of the first embodiment. In addition, an example has been described in which both the structure in which the wiring pattern of the circuit board 30 is sandwiched between the base 10 and the nut 6 and the configuration in which the base 10 is provided with the pedestal portion 18 to ensure the gap G between the circuit board 30 and the base 10 are applied, but the present invention is not limited thereto. For example, when the electronic component 40 is not mounted on the surface of the circuit board 30 facing the base 10, the gap G is not necessarily required, and in this case, the pedestal portion 18 can be omitted. On the other hand, when it is not necessary to use the fastening force by the male screw 11 and the nut 6 for the FG, the structure in which the wiring pattern of the circuit board 30 is sandwiched between the base 10 and the nut 6 can be omitted.

Fifth Embodiment

Figure 19:
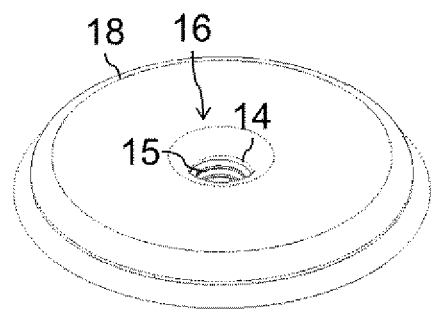
FIG. 19 is an enlarged view of a female screw provided on a base of an in-vehicle control device according to a fifth embodiment of the present invention.
Figure 20:
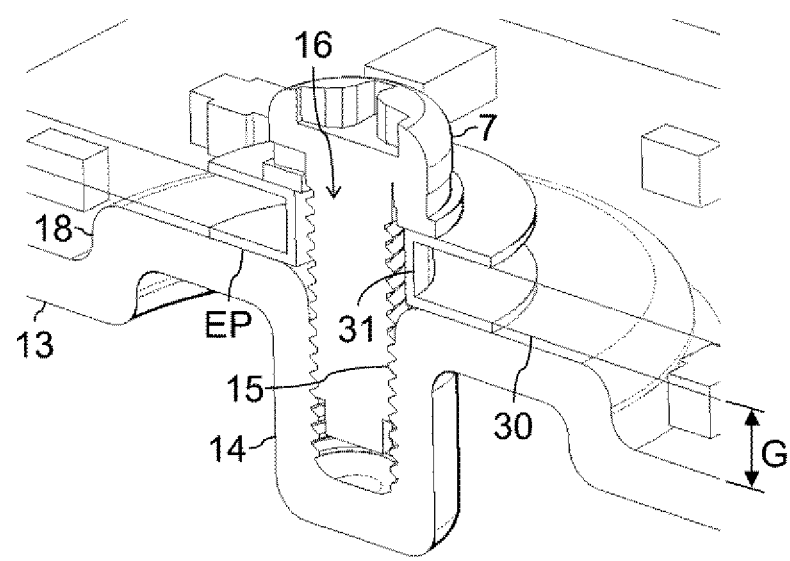
FIG. 20 is a cross-sectional view of an example of a fastening structure using the female screw illustrated in FIG. 19.
Figure 21:
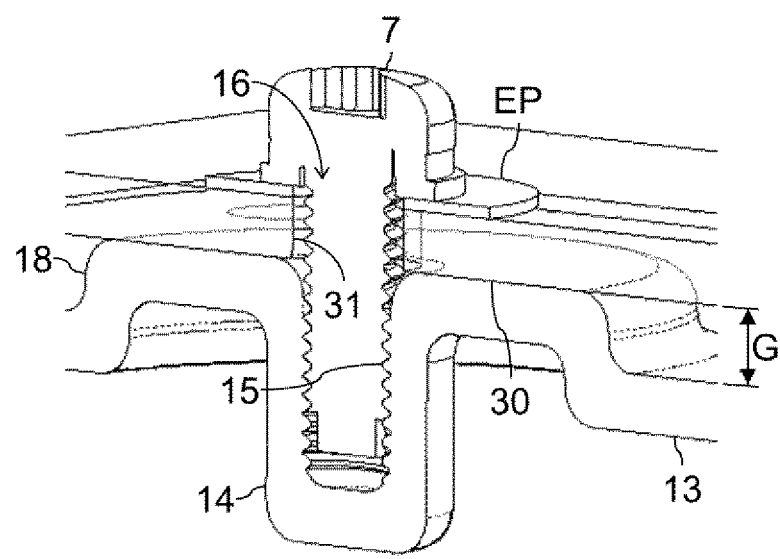
FIG. 21 is a cross-sectional view of another example of the fastening structure using the female screw illustrated in FIG. 19.
Figure 22:
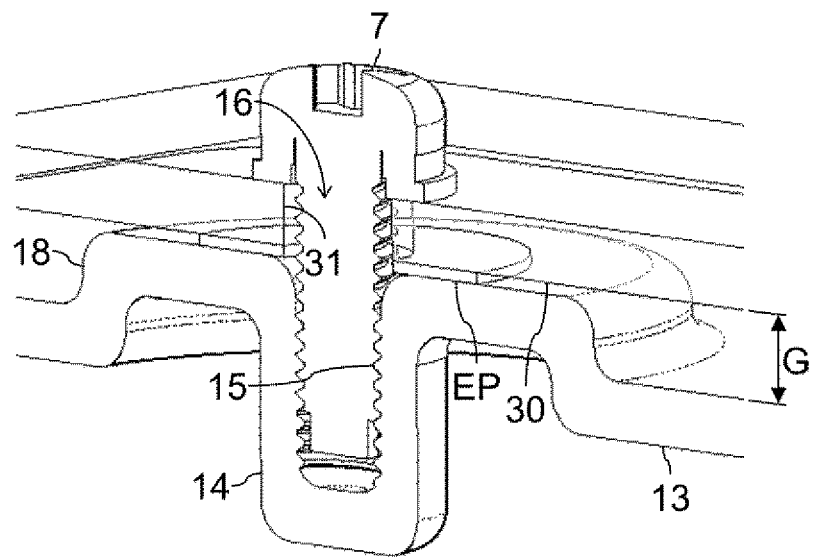
FIG. 22 is a cross-sectional view of still another example of the fastening structure using the female screw illustrated in FIG. 19.

FIG. 19 is an enlarged view of a female screw provided in a base of an in-vehicle control device according to a fifth embodiment of the present invention, and FIG. 20 is a cross-sectional view of an example of a fastening structure using the female screw illustrated in FIG. 19. FIG. 21 is a cross-sectional view of another example of the fastening structure using the female screw illustrated in FIG. 19, and FIG. 22 is a cross-sectional view of still another example of the fastening structure using the female screw illustrated in FIG. 19. In FIGS. 19 to 22, the same or corresponding parts as those in the already described embodiments are denoted by the same reference numerals as those in the previously described drawings, and description thereof is omitted.

The present embodiment is a configuration example in which the male screw 11 and the nut 6 of the fourth embodiment are replaced with the female screw 16 and the screw 7 similar to those of the second embodiment. That is, the base 10 is in contact with the wiring pattern of the circuit board 30 directly or via a fastening member (the screw 7 in the present embodiment), and the circuit board 30 and the base 10 are electrically connected. The base 10 is provided with the pedestal portion 18 protruding from the main body portion 13 toward the circuit board 30, and the female screw 16 is formed at the central portion of the pedestal portion 18. The example of FIG. 20 corresponds to the configuration example of FIG. 16 of the fourth embodiment, the configuration example of FIG. 21 corresponds to the configuration example of FIG. 17 of the fourth embodiment, and the configuration example of FIG. 22 corresponds to the configuration example of FIG. 18 of the fourth embodiment.

Other configurations are similar to those of the fourth embodiment. However, as in the fourth embodiment, both the structure in which the wiring pattern of the circuit board 30 is sandwiched between the base 10 and the screw 7 and the configuration in which the base 10 is provided with the pedestal portion 18 to ensure the gap G between the circuit board 30 and the base 10 are not necessarily essential, and one can be appropriately omitted. Although the case where the female screw 16 similar to that of the second embodiment is applied has been exemplified, the female screw 16 similar to that of the third embodiment (configuration using the insert nut 17) may be applied.

Also in the present embodiment, effects similar to those of the fourth embodiment can be obtained.

Sixth Embodiment

Figure 23:
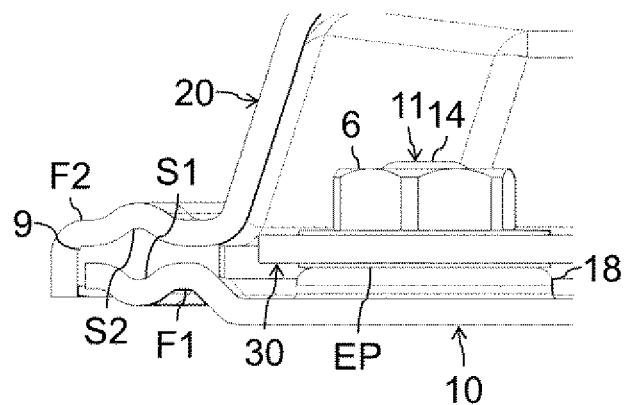
FIG. 23 is a cross-sectional view of a main part of an in-vehicle control device according to a sixth embodiment of the present invention.

FIG. 23 is a cross-sectional view of a main part of an in-vehicle control device according to a sixth embodiment of the present invention. In FIG. 23, the same or corresponding parts as those in the already described embodiments are denoted by the same reference numerals as those in the previously described drawings, and description thereof is omitted.

The present embodiment is different from the first embodiment in that grooves S1 and S2 facing each other and extending along the flanges F1 and F2 are provided on opposing surfaces of the flanges F1 and F2 of the base 10 and the cover 20. FIG. 23 illustrates a case where the cross sections of the grooves S1 and S2 have a curved shape. However, the cross sections may have a corner shape obtained by combining straight lines. The seal 9 extending along the flanges F1 and F2 is interposed between the flanges F1 and F2 of the base 10 and the cover 20. The cross-sectional shape of the seal 9 of the present embodiment corresponds to the cross-sectional shapes of the grooves S1 and S2 of the flanges F1 and F2, and the grooves S1 and S2 of the base 10 and the cover 20 are filled with the seal 9 interposed between the flanges F1 and F2. The seal 9 has, for example, a waterproof adhesion function, and is applied to opposing surfaces of the flanges F1 and F2.

In other respects, the present embodiment has a configuration similar to that of the fourth embodiment, for example. However, the configuration of the present embodiment is also applicable to embodiments other than the fourth embodiment.

According to the present embodiment, in addition to the same effects as those of the described embodiment, the creepage distance between the inside and the outside of the control device 1 can be extended by providing the grooves S1 and S2 in the flanges F1 and F2 of the base 10 and the cover 20. By filling the seal 9 between the flanges F1 and F2 to fill the grooves S1 and S2, the waterproof performance is also improved.

The seal structure between the flanges F1 and F2 is not limited to the shape illustrated in FIG. 23, and a known seal structure can be applied.

Seventh Embodiment

Figure 24:
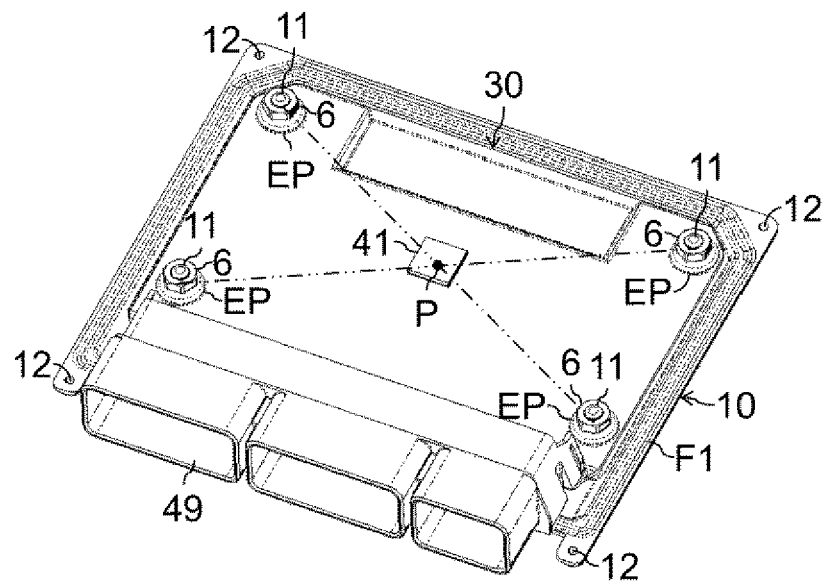
FIG. 24 is a view illustrating a layout of a BGA package in a first configuration example of an in-vehicle control device according to a seventh embodiment of the present invention.
Figure 25:
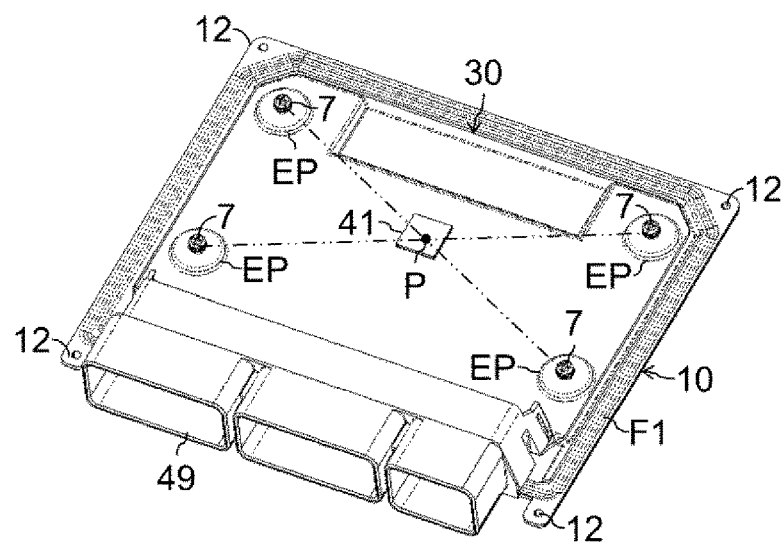
FIG. 25 is a view illustrating a layout of a BGA package in a second configuration example of the in-vehicle control device according to the seventh embodiment of the present invention.

FIG. 24 is a view illustrating a layout of a BGA package in a first configuration example of an in-vehicle control device according to a seventh embodiment of the present invention, and FIG. 25 is a view illustrating a layout of a BGA package in a second configuration example of the in-vehicle control device according to the seventh embodiment of the present invention. The first configuration example of FIG. 24 is an example in which the base 10 and the circuit board 30 are fastened with the male screw 11 and the nut 6, and the second configuration example of FIG. 25 is an example in which the base 10 and the circuit board 30 are fastened with the female screw 16 and the screw 7. In FIGS. 24 and 25, the same or corresponding parts as those in the already described embodiments are denoted by the same reference numerals as those in the previously described drawings, and description thereof is omitted.

As described above, a plurality of (four in total at four corners in the example of FIGS. 24 and 25) fastening portions between the base 10 and the circuit board 30 by the cylindrical portion 14 (the male screw 11 or the female screw 16) and the fastening member (the nut 6 or the screw 7) are provided along the outer edge of the circuit board 30. The control device 1 of the present embodiment includes, as one of the electronic components 40, a BGA package 41 disposed at the center of the region surrounded by the plurality of fastening portions. In FIGS. 24 and 25, the BGA package 41 is disposed to overlap with a position P where two diagonal lines (two-dot chain lines) of a quadrangle having four fastening portions (that is, portions where the nuts 6 or the screws 7 are disposed) at four corners of the circuit board 30 as vertices intersect. Alternatively, the BGA package 41 is disposed at a location closer to the above-described intersecting position P than the fastening portion.

In other respects, the present embodiment has a configuration similar to that of the fourth embodiment, for example. However, the configuration of the present embodiment is also applicable to embodiments other than the fourth embodiment.

According to the present embodiment, it is possible to improve the connection reliability of the soldered portion of the BGA package 41 in addition to the same effects as those of the described embodiment. Specifically, vibration or impact may be applied to the control device 1, or the base 10 and the cover 20 may expand or contract due to a temperature change, so that stress concentration may occur at a portion rigidly fixed by the nut 6 or the screw 7. Even in such a case, in the present embodiment, since the distance between each fastening portion and the BGA package 41 is ensured as much as possible, it is possible to suppress the transmission of the influence of the stress concentration generated in each fastening portion on the BGA package 41.

Eighth Embodiment

Figure 26:
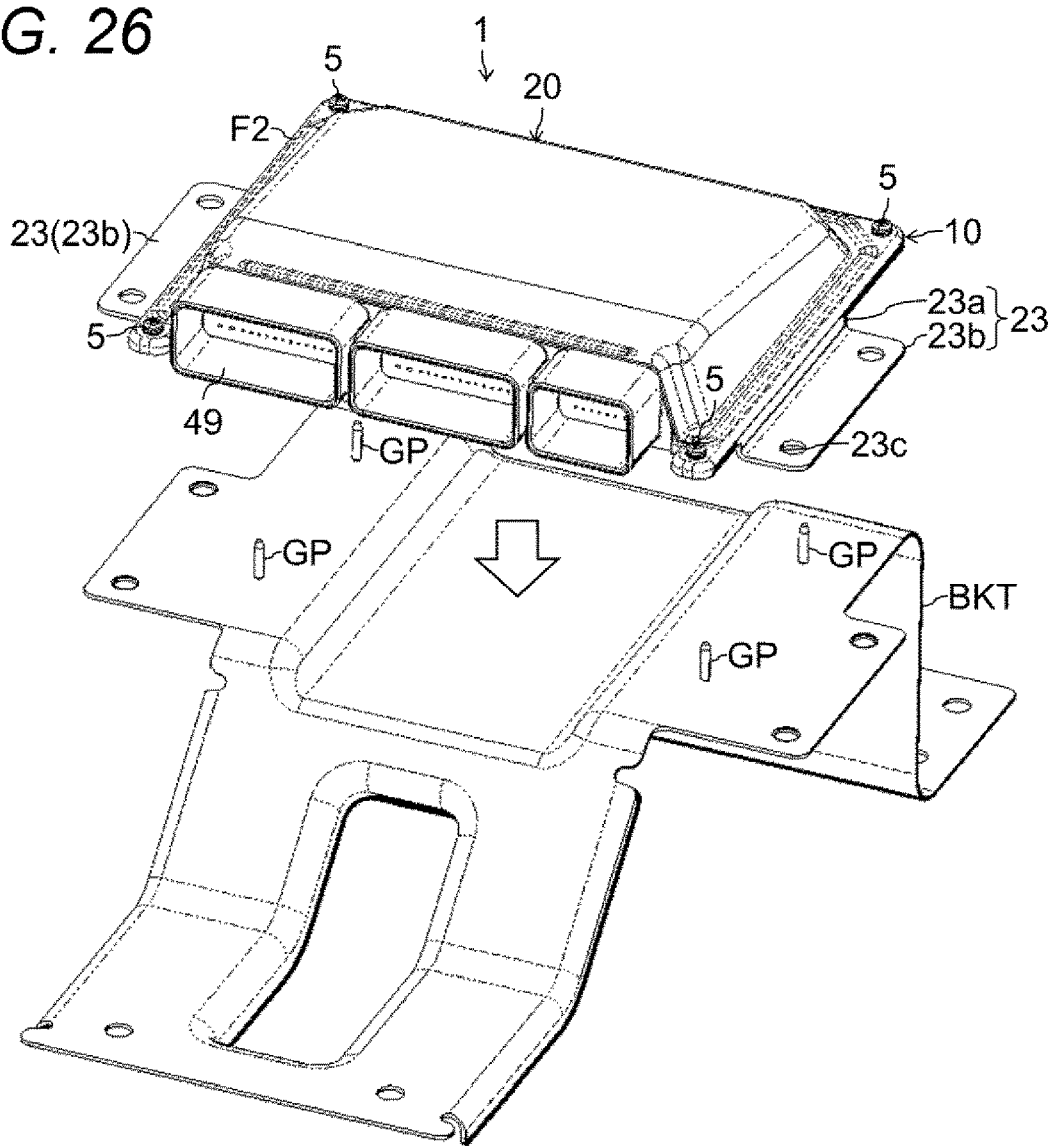
FIG. 26 is a perspective view illustrating a state in which an in-vehicle control device according to an eighth embodiment of the present invention is attached to a structure of an automobile.
Figure 27:
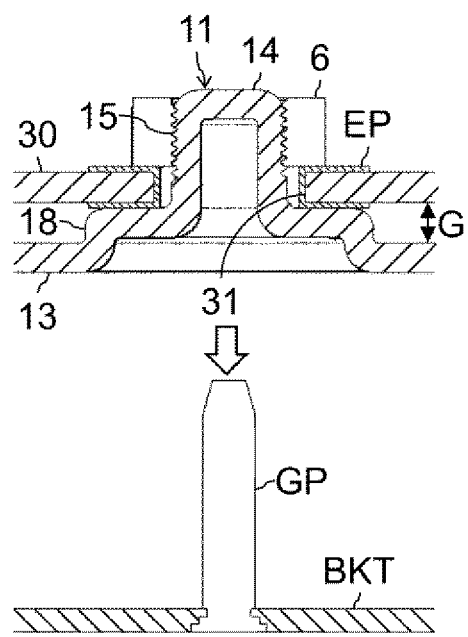
FIG. 27 is a cross-sectional view of a main part of the perspective view illustrated in FIG. 26.
Figure 28:
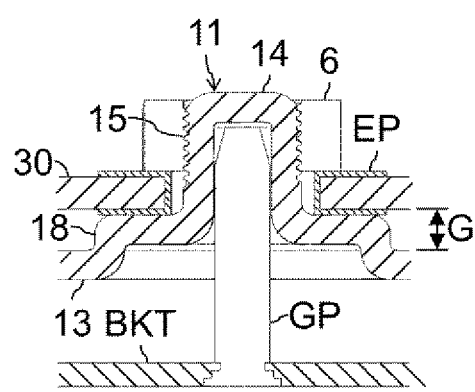
FIG. 28 is a cross-sectional view of the main part illustrating a state in which the in-vehicle control device illustrated in FIG. 26 is mounted on the structure of the automobile.

FIG. 26 is a perspective view illustrating a state in which an in-vehicle control device according to an eighth embodiment of the present invention is attached to a structure of an automobile, FIG. 27 is a cross-sectional view of a main part of the perspective view illustrated in FIG. 26, and FIG. 28 is a cross-sectional view of the main part illustrating a state in which the in-vehicle control device illustrated in FIG. 26 is mounted on the structure of the automobile. In FIGS. 26 to 28, the same or corresponding parts as those in the already described embodiments are denoted by the same reference numerals as those in the previously described drawings, and description thereof is omitted.

The present embodiment is different from the first embodiment in that the inner peripheral portion of the cylindrical portion 14 constituting the male screw 11 also serves as a guide hole into which a guide pin GP provided on a structure of an automobile (in this example, an automobile side bracket BKT) is inserted.

In other respects, the present embodiment has a configuration similar to that of the first embodiment, for example. However, the configuration of the present embodiment is also applicable to embodiments other than the first embodiment (excluding the embodiments in which the cylindrical portion 14 constitutes the female screw 16).

According to the present embodiment, effects similar to those of the described embodiment can be obtained. In addition, in the present embodiment, when the control device 1 is mounted on an automobile, the guide pin GP provided on the automobile side bracket BKT is inserted into the columnar space inside the cylindrical portion 14, and the control device 1 can be easily positioned with respect to the automobile side bracket BKT. Therefore, a through hole 23c (FIG. 26) of the bracket 23 for attaching the control device 1 to the structure of the automobile can be set to a large size with a margin with respect to a screw (not illustrated) for fastening the control device 1 and the structure of the automobile, and the mounting work of the control device 1 can be facilitated.

Ninth Embodiment

Figure 29:
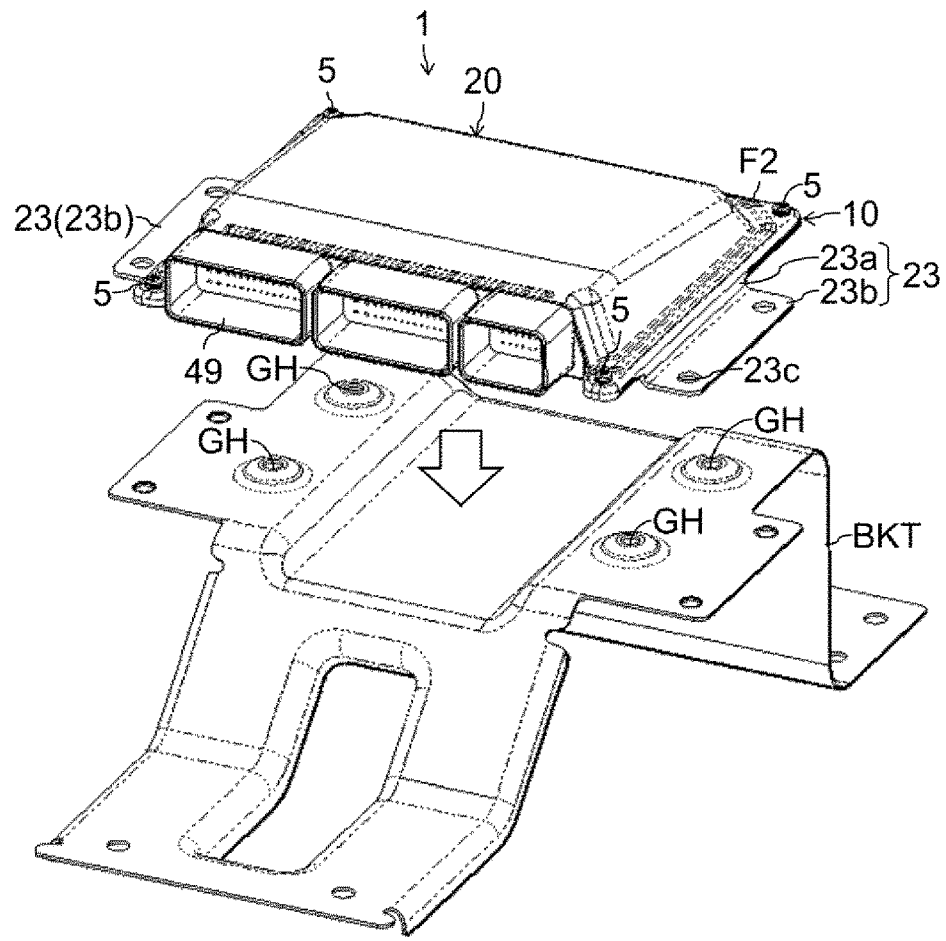
FIG. 29 is a perspective view illustrating a state in which an in-vehicle control device according to a ninth embodiment of the present invention is attached to a structure of an automobile.
Figure 30:
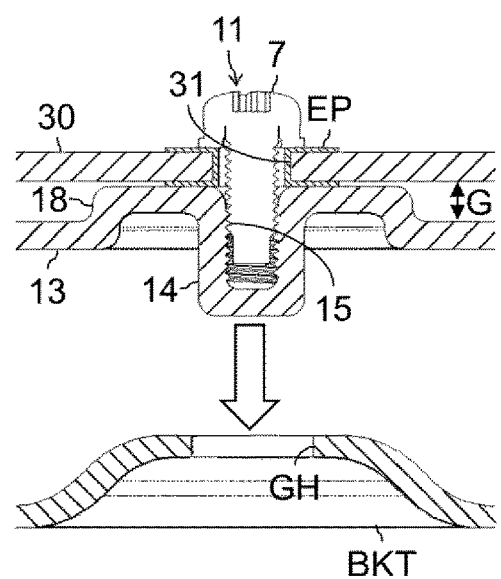
FIG. 30 is a cross-sectional view of a main part of the perspective view illustrated in FIG. 29.
Figure 31:
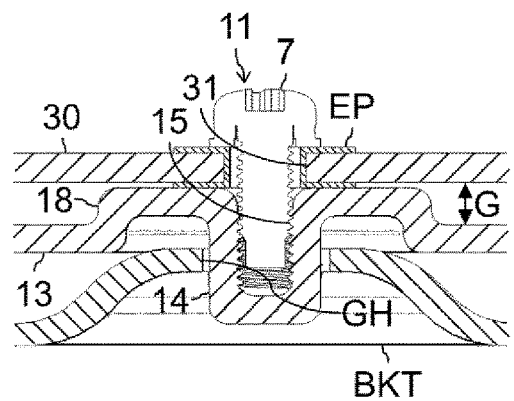
FIG. 31 is a cross-sectional view of the main part illustrating a state in which the in-vehicle control device illustrated in FIG. 29 is mounted on the structure of the automobile.

FIG. 29 is a perspective view illustrating a state in which an in-vehicle control device according to a ninth embodiment of the present invention is attached to a structure of an automobile, FIG. 30 is a cross-sectional view of a main part of the perspective view illustrated in FIG. 29, and FIG. 31 is a cross-sectional view of the main part illustrating a state in which the in-vehicle control device illustrated in FIG. 29 is mounted on the structure of the automobile. FIGS. 29 to 31 correspond to FIGS. 26 to 28 of the eighth embodiment. In FIGS. 29 to 31, the same or corresponding parts as those in the already described embodiments are denoted by the same reference numerals as those in the previously described drawings, and description thereof is omitted.

The present embodiment is different from the second embodiment in that the outer peripheral portion of the cylindrical portion 14 constituting the female screw 16 also serves as a guide hole GH provided in a structure of an automobile (in this example, the automobile side bracket BKT).

In other respects, the present embodiment has a configuration similar to that of the second embodiment, for example. However, the configuration of the present embodiment is also applicable to embodiments other than the second embodiment (excluding the embodiment in which the cylindrical portion 14 constitutes the male screw 11). For example, although the case where the female screw 16 similar to that of the second embodiment is applied has been exemplified, the female screw 16 similar to that of the third embodiment (configuration using the insert nut 17) may be applied.

Also in the present embodiment, effects similar to those of the described embodiment can be obtained. In addition, when the control device 1 is mounted on an automobile, the cylindrical portion 14 is inserted into the guide hole GH provided in the automobile side bracket BKT, and thus the control device 1 can be easily positioned with respect to the automobile side bracket BKT. Therefore, effects similar to those of the eighth embodiment can be obtained.

Tenth Embodiment

Figure 32:
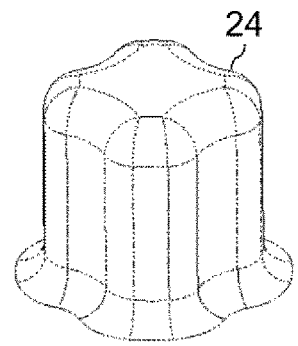
FIG. 32 is a perspective view of a male screw in a semi-finished state according to a tenth embodiment of the present invention.
Figure 33:
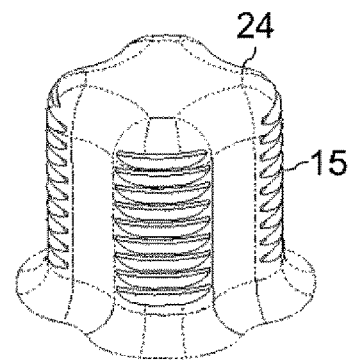
FIG. 33 is a perspective view of a male screw according to the tenth embodiment of the present invention.
Figure 34:
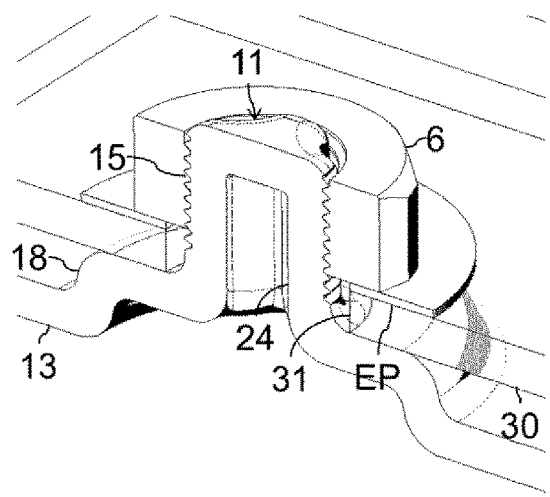
FIG. 34 is a cross-sectional view of an example of a fastening structure using a male screw according to the tenth embodiment of the present invention.

In the present embodiment, a modification example of the cylinder formed on the base will be described. In the first to ninth embodiments, the cylinder (cylindrical portion 14) having a cylindrical shape has been described as an example, but as illustrated in FIGS. 32 to 34, for example, a cross-shaped cylinder 24 can be applied as the shape of the cylinder. FIG. 32 illustrates a cross-shaped cylinder 24 in a semi-finished state formed by press molding of the base 10. The cylinder 24 has a U-shaped cross section in which one of front and back surfaces of the main body portion is recessed and protrudes to the other side, and is a non-penetrating bottomed portion. FIG. 33 illustrates an example in which the screw portion 15 is formed on the cross-shaped outer peripheral surface of the cylinder 24 by die processing. FIG. 34 illustrates an example in which the circuit board 30 is fixed using the cross-shaped cylinder 24 including the pedestal 18. The circuit board 30 is sandwiched between the pedestal 18 and the nut 6, and the nut 6 is tightened to the screw portion 15 of the cylinder 24, whereby the board 30 is fixed.

In this way, the shape of the cylinder provided in the base is not limited to a cylindrical shape or a cross shape, and other shapes can be employed as long as the cylinder can be formed by press molding and the screw portion can be formed by die processing or tap processing.

REFERENCE SIGNS LIST 1 in-vehicle control device
6 nut (fastening member)
7 screw (fastening member)
9 seal
10 base
11 male screw
13 main body portion
14 cylindrical portion (cylinder)
15 screw portion
16 female screw
17 insert nut
18 pedestal portion
20 cover
24 cylinder
30 circuit board
40 electronic component
41 BGA package (electronic component)
EP electrode pad (wiring pattern)
F1, F2 flange
GH guide hole
GP guide pin
P point (center of region surrounded by fastening portion)
S1, S2 groove
X diameter of root portion of cylindrical portion
Y diameter of tip portion of cylindrical portion

The invention claimed is:
1. An in-vehicle control device comprising:
a base;

a cover fixed to the base;
a circuit board housed in the base and the cover; and
an electronic component mounted on the circuit board, wherein
the base is made of a steel plate material, and includes a plate-shaped main body portion, a bottomed cylinder having a U-shaped cross section in which one of front and back surfaces of the main body portion is recessed and protrudes to another side, and a screw portion provided on a peripheral surface of the cylinder, and
the circuit board is fastened to the base by a fastening member screwed into the screw portion of the cylinder.

2. The in-vehicle control device according to claim 1, wherein the steel plate material is an aluminum plate material.

3. The in-vehicle control device according to claim 1, wherein
the cylinder constitutes a male screw having the screw portion on an outer peripheral surface, and
the fastening member is a nut.

4. The in-vehicle control device according to claim 3, wherein an inner peripheral portion of the cylinder also serves as a guide hole into which a guide pin provided in a structure of an automobile is inserted.

5. The in-vehicle control device according to claim 1, wherein a diameter of a peripheral surface of the cylinder has a difference of 0.1 mm or less between a root portion close to the main body portion and a tip portion far from the main body portion.

6. The in-vehicle control device according to claim 1, wherein
the cylinder constitutes a female screw having the screw portion on an inner peripheral surface, and
the fastening member is a screw.

7. The in-vehicle control device according to claim 6, wherein an outer peripheral portion of the cylinder also serves as a guide pin inserted into a guide hole provided in a structure of an automobile.

8. The in-vehicle control device according to claim 1, wherein
the cylinder constitutes a female screw by attaching an insert nut as the screw portion to an inner peripheral surface, and
the fastening member is a screw.

9. The in-vehicle control device according to claim 1, wherein the base is in contact with a wiring pattern of the circuit board directly or via the fastening member, and is electrically connected to the circuit board.

10. The in-vehicle control device according to claim 1, wherein
the base includes a pedestal portion protruding stepwise from the main body portion toward the circuit board,
the cylinder is provided on the pedestal portion, and
the circuit board is sandwiched between the pedestal portion and the fastening member, and is separated from the main body portion with the pedestal portion interposed between the circuit board and the main body portion of the base.

11. The in-vehicle control device according to claim 1, wherein
the base and the cover each have a flange for fastening the base and the cover to each other on an outer peripheral portion,
the flanges of the base and the cover are provided with grooves facing each other and extending along the flanges, and
a seal extending along the flange is interposed between the flanges of the base and the cover, and the grooves of the base and the cover are filled with the seal.

12. The in-vehicle control device according to claim 1, wherein
a plurality of fastening portions between the base and the circuit board by the cylinder and the fastening member are provided along an outer edge of the circuit board, and
the electronic component includes a BGA package disposed at a center of a region surrounded by the plurality of fastening portions.

13. A manufacturing method of an in-vehicle control device including:
a base;
a cover fixed to the base;
a circuit board housed in the base and the cover; and
an electronic component mounted on the circuit board, the manufacturing method comprising:
forming the base by press-molding a steel plate material into a shape having a plate-shaped main body portion and a bottomed cylinder having a U-shaped cross section in which one of front and back surfaces of the main body portion is recessed and protrudes to another side, and then forming a screw portion on a peripheral surface of the cylinder by die processing or tap processing, and
fastening the circuit board to the base by a fastening member screwed into the screw portion of the cylinder.

\* \* \* \* \*